United States Patent
Wang et al.

(10) Patent No.: US 11,199,736 B2
(45) Date of Patent: Dec. 14, 2021

(54) ELECTRONIC DEVICE

(71) Applicant: InnoLux Corporation, Miao-Li County (TW)

(72) Inventors: Kuan-Jen Wang, Miao-Li County (TW); Chien-Chih Chen, Miao-Li County (TW); Chih-Chieh Fan, Miao-Li County (TW); Chin-Der Chen, Miao-Li County (TW); Cheng-Fu Wen, Miao-Li County (TW); Chin-Lung Ting, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 89 days.

(21) Appl. No.: 16/395,076

(22) Filed: Apr. 25, 2019

(65) Prior Publication Data

US 2019/0361285 A1 Nov. 28, 2019

Related U.S. Application Data

(60) Provisional application No. 62/675,771, filed on May 24, 2018.

(30) Foreign Application Priority Data

Oct. 26, 2018 (CN) .......................... 201811256224.3

(51) Int. Cl.
  *G02F 1/1333* (2006.01)
  *H01L 51/00* (2006.01)
  *H04M 1/02* (2006.01)

(52) U.S. Cl.
  CPC .... *G02F 1/133305* (2013.01); *H01L 51/0097* (2013.01); *G06F 2203/04102* (2013.01); *H04M 1/0216* (2013.01); *H05K 2201/056* (2013.01)

(58) Field of Classification Search
  CPC ......... G06F 1/1652; G06F 2203/04102; H01L 51/0097; G02F 1/133305; G09F 9/301
  See application file for complete search history.

(56) References Cited

U.S. PATENT DOCUMENTS

| 2013/0169515 A1* | 7/2013 | Prushinskiy | G06F 1/1652 345/55 |
| 2014/0183473 A1* | 7/2014 | Lee | G06F 1/1641 257/40 |
| 2014/0295150 A1* | 10/2014 | Bower | B32B 15/085 428/201 |

(Continued)

FOREIGN PATENT DOCUMENTS

| CN | 201174842 Y | 12/2008 |
| CN | 104521331 A | 4/2015 |

(Continued)

*Primary Examiner* — Michael H Caley
*Assistant Examiner* — Jonathan Y Jung
(74) *Attorney, Agent, or Firm* — Muncy, Geissler, Olds & Lowe, P.C.

(57) ABSTRACT

An electronic device is disclosed, which includes a first substrate structure, a flexible substrate and a first recess. The flexible substrate is disposed on the first substrate structure. The first recess is disposed on a first surface of the flexible substrate, and the first surface is close to the first substrate structure, wherein the first recess at least overlaps the first substrate structure.

20 Claims, 6 Drawing Sheets

(56) References Cited

U.S. PATENT DOCUMENTS

| | | | |
|---|---|---|---|
| 2015/0049428 A1* | 2/2015 | Lee | G06F 1/1652 |
| | | | 361/679.27 |
| 2016/0066409 A1* | 3/2016 | Kwon | H01L 27/3276 |
| | | | 174/254 |
| 2016/0227624 A1* | 8/2016 | Yun | H05B 33/26 |
| 2016/0343964 A1* | 11/2016 | Kwon | H01L 51/0097 |
| 2017/0229674 A1* | 8/2017 | Jin | H01L 51/0097 |
| 2018/0108724 A1* | 4/2018 | Lee | H01L 27/1244 |

FOREIGN PATENT DOCUMENTS

| | | |
|---|---|---|
| CN | 104869749 A | 8/2015 |
| CN | 105472878 A | 4/2016 |

\* cited by examiner

ELECTRONIC DEVICE

CROSS REFERENCE TO RELATED APPLICATION

This application claims the benefit of filing date of U.S. Provisional Application Ser. No. 62/675,771, filed May 24, 2018 under 35 USC § 119(e)(1).

This application claims the benefits of the Chinese Patent Application Serial Number 201811256224.3, filed on Oct. 26, 2018, the subject matter of which is incorporated herein by reference.

BACKGROUND

1. Field

The present disclosure relates to electronic devices, and more particularly to an electronic device having a flexible substrate.

2. Description of Related Art

The modern electronic devices (such as displays) usually use flexible substrates to achieve "almost" seamless or bezel-less designs. In these applications, a flexible substrate is subject to operations where a part thereof is bent to a reverse side of a base substrate structure on which it is located for minimizing the bezel of the electronic device in size. However, given that the flexible substrate carries precise wiring and/or components, an excessive bending operation degree (such as one that makes the bent part of the flexible substrate lean against the lateral of the base substrate structure) tends to damage the circuit and/or components in the bent part. Therefore, a substantial size of a bezel has to be maintained in the designs of the prior art to accommodate the bent part, meaning that the bent part of the flexible substrate is separated from the lateral of the first substrate structure by a certain distance, so as to prevent excessive bending operations. However, this approach makes designers limited to the bezel and prevents real bezel-less or seamless designs from being realized.

SUMMARY

For addressing the aforementioned issue, the present disclosure provides an electronic device that features an improved flexible substrate.

The disclosed electronic device comprises: a first substrate structure, a flexible substrate and a first recess. The flexible substrate is disposed on the first substrate structure. The first recess is disposed on a first surface of the flexible substrate. The first surface is close to first substrate structure. The first recess at least overlaps the first substrate structure.

DETAILED DESCRIPTION

Figure 1A:
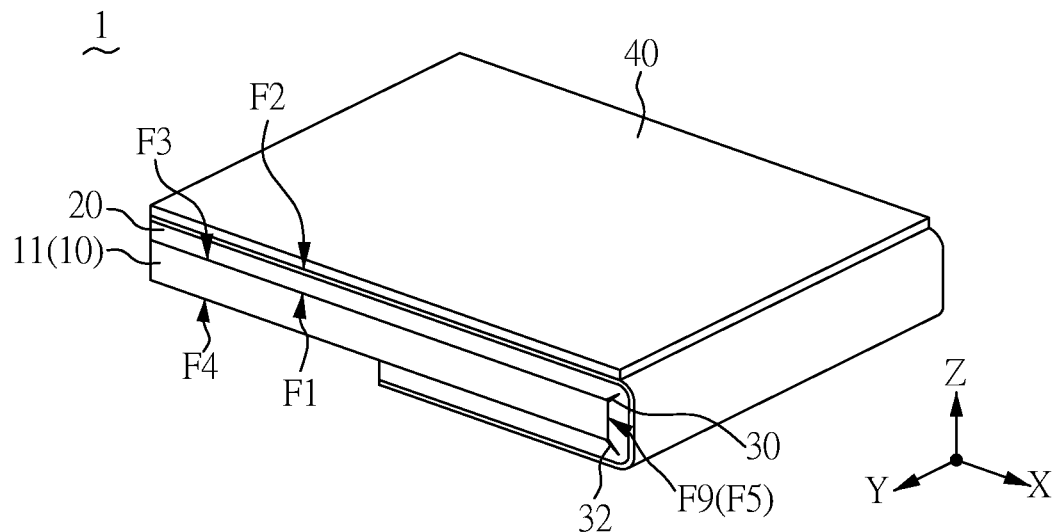
FIG. 1(A) is a perspective view of an electronic device according to one embodiment of the present disclosure.

In the following description, certain specific embodiment will be explained to illustrate the present disclosure. People skilled in the art will readily understand these and other advantages and effects of the present disclosure by reading the disclosure. The present disclosure may be implemented or applied using different specific embodiment. All the details given herein may be modified and altered for meeting various aspects and applications without departing from the scope of the present disclosure. Furthermore, the embodiments described herein may be combined or made work together.

In addition, all the ordinals used throughout the disclosure and the claims such as "first" and "second" are for describing the components they are associated with and the used thereof is intended neither to mean that any component bearing a preceding ordinal exists other than the claimed component, nor to set a specific order of the claimed components or procedural steps. The use of ordinals is only for clearly differentiating a claimed component having one designation from another claimed component having the same designation.

Additionally, it is to be noted that, as used herein, any description referring to "when . . . " or "at the time of . . . " incorporates the meanings of "at present, before or after," and is unnecessarily be of coincidence. Any description referring to "disposed . . . " is a form to express relative position between two components, and does not necessarily indicate whether the two components are in contact, unless stated differently. Besides, the term "disposed" may mean "mounted on" or "located in" and the drawings shall be referred to for interpretation. Particularly, "disposed" may be achieved by means of fixing, pivoting, placing, adhering or other ways that can make the corresponding relation exist between two components, and all these shall fall within the scope of the present disclosure. Moreover, where plural effects (or components) are recited in the disclosure, as long as the plural effects (or components) are linked with "or", it means these effects (or components) may exist independently or simultaneously, without limitation. Besides, where the phrase "electrically connected" or "coupled" is used in the disclosure, both direct and indirect connection are included.

Furthermore, as used in description of components, the terms "length," "width," and "thickness" may be not defined in an absolute directions, but have different meanings according to the related components themselves. Thus, edges of two components extending in the same direction may each have a different definition. For example, where a component extends longer in the direction of the X axis and extends shorter in the direction of the Y axis, the edge of the component extending in the direction of the X axis may be called as the length of the component. On the other hand, where a component extends shorter in the direction of the X axis and extends longer in the direction of the Y axis, the edge of the component extending in the direction of the X axis may be called the width (or thickness) of the component.

FIG. 1(A) is a perspective view of the electronic device 1 according to one embodiment of the present disclosure. For clear illustration, the electronic device 1 is described with reference to the parallel XY plane in the following description. Besides, throughout the disclosure, the term "upper" or "top" is defined in the direction of the Z axis while the term "lateral" is defined in the direction of the X or Y axis.

As shown in FIG. 1(A), the disclosed electronic device 1 comprises: a first substrate structure 10, a flexible substrate 20 and a first recess 30. The first substrate structure 10 comprises a first substrate 11 and a buffer element 50 that is optional and will be further described below with reference to FIG. 1D. The flexible substrate 20 is disposed on the first substrate structure 10. The flexible substrate 20 comprises a first surface F1 and a second surface F2. The first substrate structure 10 may comprise a third surface F3, a fourth surface F4 and a lateral surface F5. In the embodiment of FIG. 1(A), since there is no the buffer element 50, the lateral surface F5 of the first substrate structure 10 acts as the lateral surface of the first substrate 11. Additionally, the first recess 30 is disposed on first surface F1. The first surface F1 is defined as the surface of the flexible substrate 20 that is close to the first substrate structure 10, and the second surface F2 is defined as the surface of the flexible substrate 20 that is away from the first substrate structure 10. The first surface F1 and the second surface F2 may be opposite to each other. In one embodiment, the first surface F1 and the second surface F2 may be parallel and facing each other, without limitation. The first recess 30 at least overlaps the first substrate structure 10 in the direction of the Z axis. As used herein, the term "overlaps" refers to that projection of two components casted along a certain direction in a reference plane have an overlapping region in the reference plane. In one embodiment, in the direction of the Z axis, the phrase "the first recess 30 at least overlaps the first substrate structure 10" refers to that the projection of the first recess 30 along the direction of the Z axis in the XY plane at least overlaps the projection of the third surface F3 in the reference plane, or, in one cross-sectional view, the first substrate structure 10 at least overlaps the first recess 30 when a reference line that is parallel to the Z axis can pass through both of the first substrate structure 10 and the first recess 30. In one embodiment, when the flexible substrate 20 is bent, the first recess 30 at least overlaps a lateral surface F5 of the first substrate structure 10, and the first recess 30 at least overlaps the third surface F3 or the first recess 30 at least overlaps both the lateral surface F5 and the third surface F3. In one embodiment, the flexible substrate 20 may further have a second recess 32. The second recess may be disposed on the first surface F1, so that when the flexible substrate 20 is bent, the second recess 32 also at least overlaps the first substrate structure 10. For example, the second recess 32 at least overlaps the fourth surface F4 and the lateral surface F5.

In one embodiment, the electronic device 1 further comprises a display medium layer 40. In view of the Z direction, the display medium layer 40 may be disposed on the flexible substrate 20. In one embodiment, the display medium layer 40 may be slightly greater than the first substrate structure 10, but not going beyond the vertex of the first recess 30, while the present is not limited thereto. The display medium layer 40 may alternatively smaller than the first substrate structure 10. In one embodiment, the first substrate structure 10 may have an upper surface (a third surface) F3, a lower surface (a fourth surface) F4 and a lateral surface F5. The upper surface F3 may be close to the flexible substrate 20 and contact the first surface F1. In view of the Z direction, the lateral surface F5 may have its one end connected to the upper surface F3 and have its opposite end connected to the lower surface F4. In one embodiment, the upper surface F3 and the lower surface F4 may be opposite surfaces substantively parallel to each other, but not limited thereto. It is to be noted that, as used herein, the phrases "upper surface," "lower surface," "upper end," and "lower end" are oriented with respect to the direction of the Z axis.

The disclosed electronic device 1 may be a device have the flexible substrate 20, such as a display device but not limited thereto. In an embodiment where the electronic device 1 is a display device, the present disclosure may be the electronic device 1 realized using the LCD technique, the OLED technique, the micro LED technique, the mini LED technique, the QLED technique or the flexible display technique, without limitation. The electronic device 1 may comprise a display medium layer 40. The display medium layer 40 may include, as non-limiting examples, a liquid crystal layer, an LED layer, an OLED layer, a mimi LED layer, a micro LED layer, a QLED layer, a flexible display medium layer, a phosphor layer, a layer of other types (including but not limited to an electro-wetting display layer, an electro-phoresis display layer, a plasma display layer), or any combination of the foregoing layers, without limitation. In one embodiment, the flexible substrate 20 may be electrically connected to and thereby power the display medium layer 40.

In addition, as shown in FIG. 1(A), the flexible substrate 20 is of a bendable structure. In the present embodiment, the flexible substrate 20 when bent can cover (at least a part of) the upper surface F3 and (at least a part of) the lateral surface F5 of the first substrate structure 10. As used herein, the phrase "cover the surface" means that the projections of the involved components in a certain direction in a reference plane overlaps each other. In some embodiments, the flexible substrate 20 when bent covers at least a part of the lateral surface F5, covers the entire lateral surface F5 or covers the entire lateral surface F5 and then covers the lower surface F4 when further bent, without limitation. Besides, in one embodiment, the first substrate 11 may comprise any material suitable for a substrate, such as an insulating material. Such a material may be, for example, glass, PET (Polyethylene Terephthalate) or PI (Polyimide), but not limited thereto. The flexible substrate 20 may comprise any material suitable for a flexible or bendable substrate, such as an insulating material. Such a material may be, for example, glass, or PI (Polyimide), but not limited thereto.

Figure 1B:
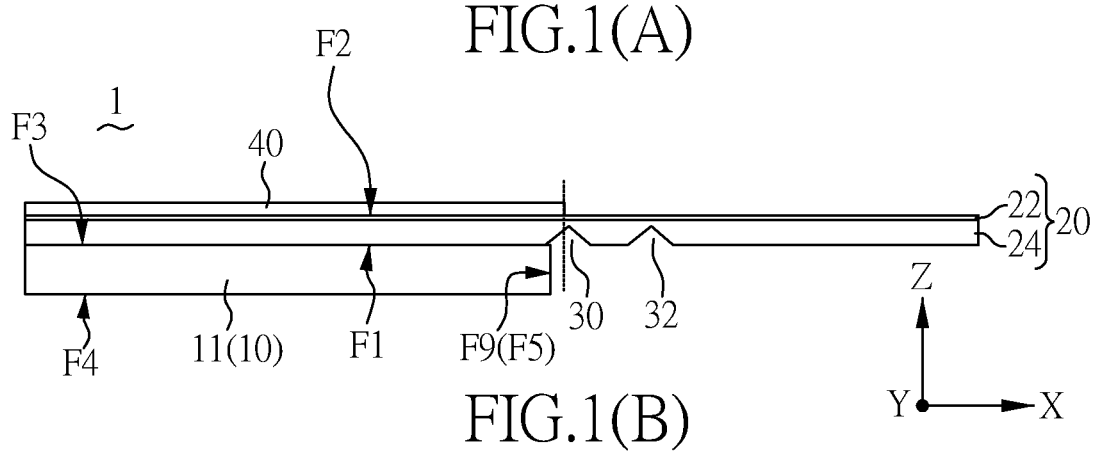
FIG. 1(B) is a detailed structure diagram of an electronic device according to one embodiment of the present disclosure.

FIG. 1(B) is a detailed structure diagram of an electronic device according to one embodiment of the present disclosure, showing the flexible substrate 20 of FIG. 1(A) not bent. As shown in FIG. 1(B), the flexible substrate 20 may comprise a circuit layer 22 and an insulating layer 24. The insulating layer 24 may be located between the circuit layer 22 and the first substrate structure 10. The circuit layer 22 may be electrically connected to the display medium layer 40, so as to transmit signals required by the display medium layer 40, such as driving signals, display data signals and so on. Besides, the circuit layer 22 may further be electrically connected to other components that need signal transmission. For example, in an embodiment where the electronic device 1 has a touch array layer, the circuit layer 22 may be electrically connected to the touch array layer, so as to transmit signals required for touch control, but not limited thereto. It is to be noted that, for the foregoing layers or substrates to be "electrically connected," the electrical connection may be realized using any reasonable way. For example, the layers may be made with metal vias, or the layers may have their electrodes connected mutually, or the layers may use wireless transmission, without limitation.

As shown in FIGS. 1(A) and 1(B), the first recess 30 or the second recess 32 may be disposed on the insulating layer 24. In view of the Z direction, the first recess 30 or the second recess 32 is a structure sunken from the first surface F1 and having increased depth as leaving from the first substrate structure 10.

Also referring to FIG. 1(B), in view of the X direction, the flexible substrate 20 extends for a length in the direction of the X axis that is greater than the length of the first substrate structure 10. While only one side is shown in FIG. 1(B), the flexible substrate 20 may be longer than the first substrate structure 10 in any direction. As shown in FIGS. 1(A) and 1(B), since the flexible substrate 20 is longer than the first substrate structure 10, the flexible substrate 20 completely covers the upper surface F3 of the first substrate structure 10, and can be bent as it goes abreast with the upper surface F3 and the lateral surface F5, so as to cover the lateral surface F5. In the present embodiment, the flexible substrate 20 can even cover the lower surface F4. The foregoing description is only illustrative. In other embodiments, the flexible substrate 20 may have its length in view of the Y directions greater than the length of the first substrate structure 10.

Figure 1C:
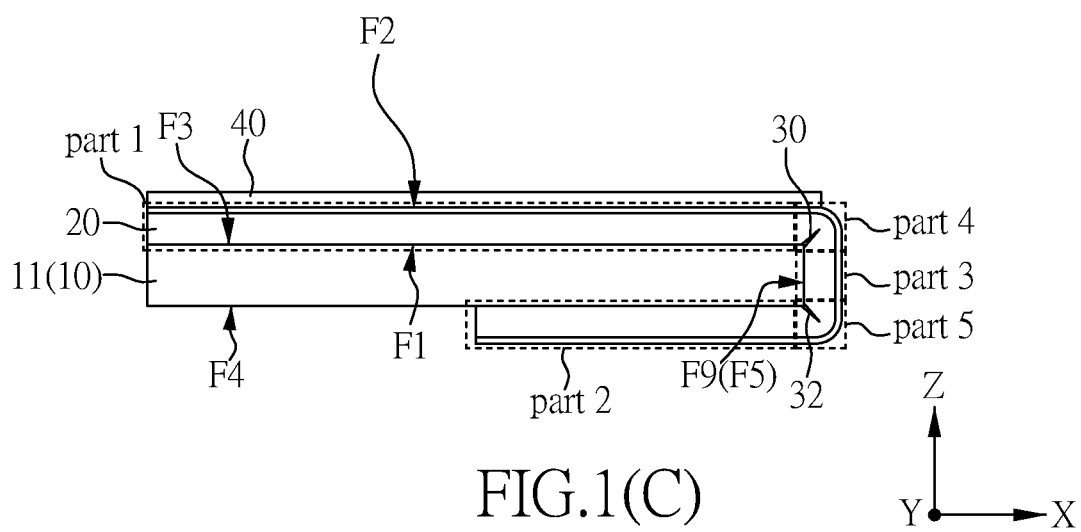
FIG. 1(C) is a detailed structure diagram of the embodiment of FIG. 1(B) showing its flexible substrate bent.

FIG. 1(C) shows in detail the flexible substrate 20 in the embodiment of FIG. 1(B) bent. As shown in FIGS. 1(A) through 1(C), the flexible substrate 20 may have a first part (part1) covering at least a part of the upper surface F3, a second part (part2) covering at least a part of the lower surface F4, a third part (part3) covering at least a part of lateral surface F5, a first bending part (part4) corresponding to a join between the upper surface F1 and the lateral surface F5, and a second bending part (part5) corresponding to the join between the lower surface F2 and the lateral surface F5. Additionally, when the flexible substrate 20 is bent (from the first part (part1) along the first bending part (part4), the third part (part3), and the second bending part (part5), to the second part (part2), for example), the first recess 30 may be located in the first bending part (part4), and the second recess may be located in the second bending part (part5).

It is to be noted that, with the first recess 30 therein, the first bending part (part4), when bent, has the outward pulling force acting on its circuit layer 22 significantly reduced, thereby preventing the circuit layer 22 in the first bending part (part4) from being pulled apart when the first bending part (part4) is bent. As used herein, the phrase "outward pulling force" refers to a pulling force going outward from the first part (part1) and the third part (part3). Similarly, with the second recess 32 therein, the second bending part (part5), when bent, has the outward pulling force acting on its circuit layer 22 significantly reduced, thereby preventing the circuit layer 22 in the second bending part (part5) from being pulled apart when the second bending part (part5) is bent. In one embodiment, the first recess 30 may have the circuit layer 22 in the first bending part (part4) located in (or very close to) the neutral layer of the entire structure, so as to protect the circuit layer 22 in the first bending part (part4) from external pulling force to at least a certain extent, without limitation. In one embodiment, the second recess 32 may also have the circuit layer 22 of the second bending part (part5) located in (or very close to) the neutral layer of the entire structure.

It is thus learned that, with the first recess 30 or the second recess 32, the flexible substrate 20 can be better bent as compared to the prior art. This makes the third part (part3) of the flexible substrate 20 better lean against the lateral surface F5 of the first substrate structure 10, thereby reducing the risk of damaging the circuit layer 22, so is more suitable for bezel-less designs or seamless applications. The first recess 30 or the second recess 32 will be described below in detail.

Figure 1D:
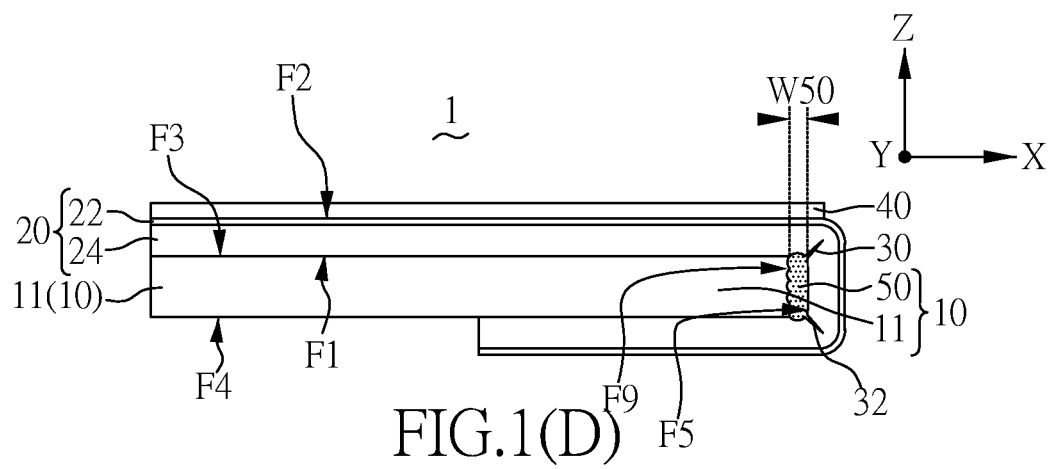
FIG. 1(D) is a detailed structure diagram of an electronic device according to another embodiment of the present disclosure.

The disclosed electronic device 1 may by alternatively configured. FIG. 1(D) is a detailed structure diagram of an electronic device according to another embodiment of the present disclosure. Similar to the embodiment as depicted in FIGS. 1(A) through 1(C), the disclosed electronic device 1 also comprises the first substrate structure 10, the flexible substrate 20 and the first recess 30, and may have a second recess 32. Furthermore, the disclosed electronic device 1 may further have a display medium layer 40. Since the first substrate structure 10, the flexible substrate 20, the first recess 30, the second recess 32, and the display medium layer 40 in the present embodiment are similar to their counterparts shown in FIGS. 1(A) through 1(C), no repeated description is given herein.

In the embodiment of FIG. 1(D), the first substrate structure 10 further comprises a buffer element 50. The buffer element 50 may contact the lateral surface F9 of the first substrate 11. In this case, the lateral surface F5 of the first substrate structure becomes the lateral surface of the buffer element 50, and the upper surface F3 of the first substrate structure 10 includes the upper surface of the first substrate 11 and the upper surface of the buffer element 50, while the lower surface F4 of the first substrate structure 10 includes the lower surface of the first substrate 11 and the lower surface of the buffer element 50. When the flexible substrate 20 is bent, in view of the Z direction, the buffer element 50 overlaps the first recess 30. Herein, since the first substrate structure 10 comprises the buffer element 50, when the buffer element 50 overlaps the first recess 30, it is a fact that the first substrate structure 10 overlaps the first recess 30. Additionally, as the flexible substrate 20 has the second recess 32, when the flexible substrate 20 is bent, the second recess 32 can also overlap the buffer element 50. Herein, since the first substrate structure 10 comprises the buffer element 50, when the second recess 32 overlaps the buffer element 50, it is a fact that the first substrate structure 10 overlaps the buffer element 50. The buffer element 50 may be at least partially disposed on the first recess 30 and the second recess 32, or it may be partially disposed in at least one recess. In one embodiment, when the third part (part3) of the flexible substrate 20 (see FIG. 1(C)) covers the lateral surface F5, the buffer element 50 contacts the first-substrate-facing surface F9 and the third part (part3). In one embodiment, the buffer element 50 may comprise an adhesive material, such as double-sided tape, UV-cured adhesive, heat-cured adhesive, without limitation. In one embodiment, In view of the X direction, the buffer element 50 may have a buffer element thickness W50. The buffer element thickness W50 is greater than 0 cm and less than or equal to 1 cm (i.e. 0 cm<W50≤1 cm), but not limited thereto. In one embodiment, the buffer element may have an uneven surface, so that the first substrate structure may have the uneven third surface F3, the uneven fourth surface F4 and the uneven lateral surface F5.

Additionally, in one embodiment, the electronic device 1 may be of a structure as depicted in FIG. 1(C) (having the third part (part3) lean against the lateral surface F9 of the first substrate 11), but have the first recess 30 or the second recess 32 filled up with the buffer element 50. Besides, in one embodiment, the electronic device 1 may of a structure as depicted in FIG. 1(C) or FIG. 1(D).

Figure 1E:
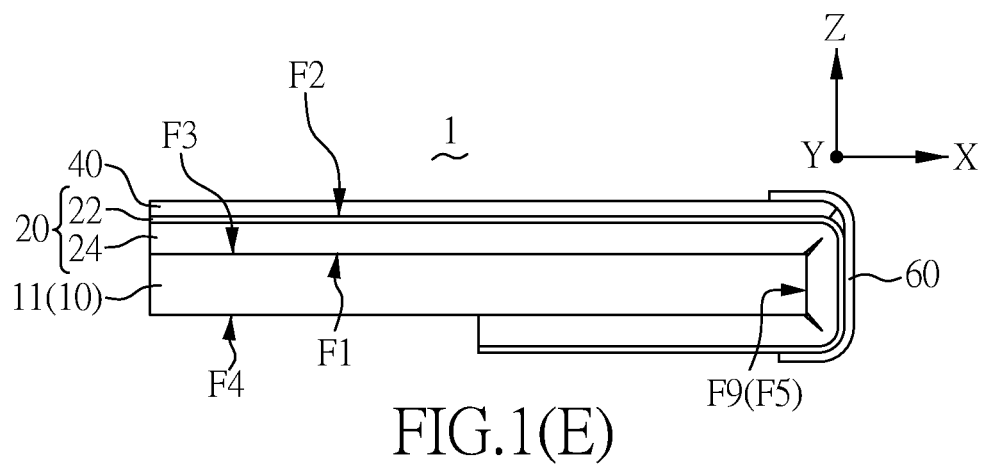
FIG. 1(E) is a detailed structure diagram of an electronic device according to still another embodiment of the present disclosure.

FIG. 1(E) is a detailed structure diagram of an electronic device 1 according to still another embodiment of the present disclosure. Similar to the embodiment shown in FIGS. 1(A) through 1(C), the disclosed electronic device 1 comprises the first substrate structure 10, the flexible substrate 20, and the first recess 30. The disclosed electronic device 1 may also have the second recess 32 and the display medium layer 40. Since the foregoing components are similar to their counterparts shown in FIGS. 1(A) through 1(D), no repeated description is given herein.

A point of the present embodiment is that the electronic device 1 may further comprise a protector 60. In one embodiment, the protector 60 at least covers the third part (part3) (see FIG. 1(C)), the first bending part (part4) (see FIG. 1(C)) and the second bending part (part5) (see FIG. 1(C)) of the flexible substrate 20, so as to protect the circuit layer 22 on the flexible substrate 20 from collision and scrape. In one embodiment where the electronic device 1 comprises the display medium layer 40, the display medium layer 40 may have a part thereof cover the first bending part (part4) (see FIG. 1(C)), so that that part of the display medium layer 40 is also covered by the protector 60.

In one embodiment, the protector 60 may comprise double-sided tape, light-cured adhesive (such as UV-cured adhesive but not limited thereto), heat-cured adhesive, and silicone rubber adhesive, without limitation. In one embodiment, the embodiment of FIG. 1(D) may be combined with that of FIG. 1(E). Particularly, the embodiment of FIG. 1(D) has a protector 60 settled on the flexible substrate 20 as depicted in FIG. 1(E).

Figure 2:
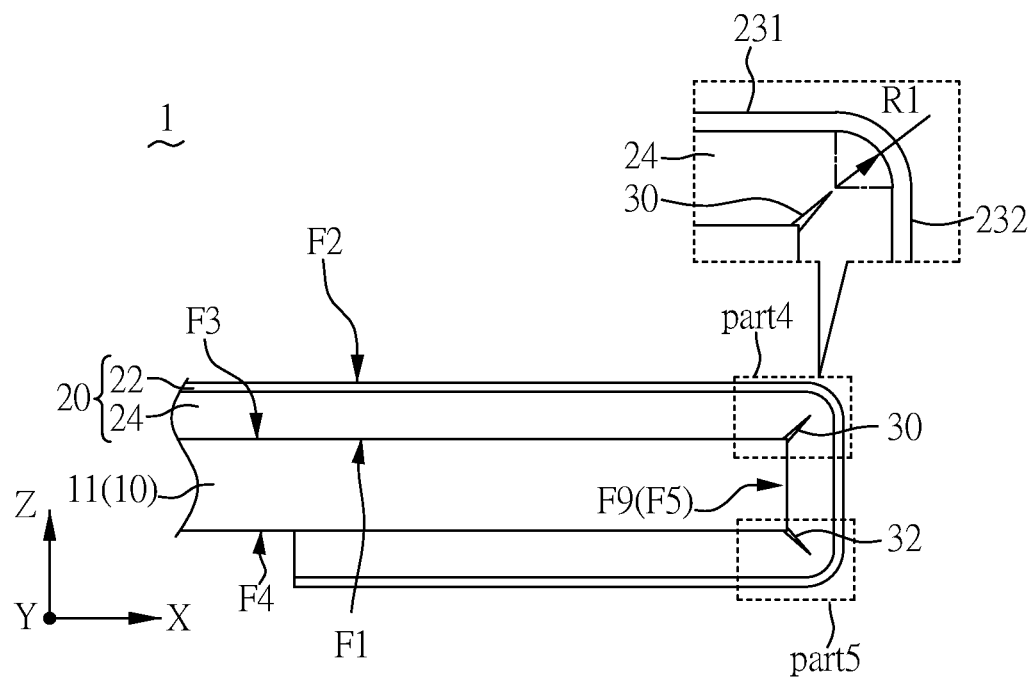
FIG. 2 is a schematic drawing of a first bending part of the flexible substrate according to one embodiment of the present disclosure.

The following description is directed to the first bending part (part4) of the flexible substrate 20. FIG. 2 is a schematic drawing of the first bending part (part4) of the flexible substrate 20 according to one embodiment of the present disclosure. As shown in FIG. 2, the first bending part (part4) may be a junction point between the upper surface F3 and the lateral surface F5 of the first substrate structure 10.

In one embodiment, the first bending part (part4) may have a bending radius of curvature (i.e. a corner edge radius) R1. The bending radius of curvature R1 may be greater than 0 microns (μm) and less than or equal to 100 microns (μm) (i.e. 0 μm<R1≤100 μm), without limitation. As used herein, the phrase "bending radius of curvature (i.e. corner edge radius) R1" may be defined as the minimal thickness at the bent part of the flexible substrate 20.

In one embodiment, the minimal thickness at the bent part may be second surface F2 is the thickness of the bent part formed between the edge 231 extending in the direction of the X axis and edge 232 extending in the direction of the Z axis (or the thinnest part of the insulating layer 24). In another embodiment, the bending radius of curvature R1 may be greater than 0 microns (μm) and less than or equal to 50 microns (μm) (i.e. 0 μm<R1≤50 μm). In yet another embodiment, the bending radius of curvature R1 may be greater than 0 microns (μm) and less than or equal to 10 microns (μm) (i.e. 0 μm<R1≤10 μm). Besides, in one embodiment, the bending angle of the first bending part (part4) (i.e. the angle formed by the bent part between the edge 231 of the second surface F2 extending in the direction of the X axis and the edge 232 of the second surface extending in the direction of the Z axis) may range between 70 degrees and 100 degrees, without limitation. Besides, in one embodiment where the flexible substrate 20 has the second bending part (part5), the description of the first bending part (part4) may apply to the second bending part (part5). For example, the second bending part (part5) may have the same bending radius of curvature R1.

With the specific bending radius of curvature R1 of the first bending part (part4) or the second bending part (part5), the flexible substrate 20 can better lean against the lateral surface F5 of the first substrate structure 10, allowing the bezel of the electronic device 1 to be minimized, thereby enabling bezel-less or seamless designs. Besides, the embodiment of FIG. 1(D) or FIG. 1(E) may also be combined with the present embodiment.

Figure 3:
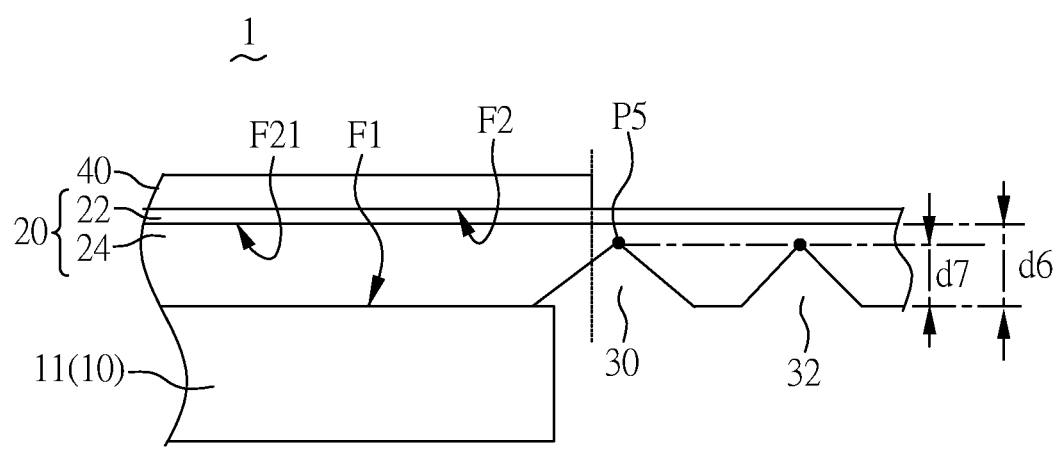
FIG. 3 is a schematic drawing of a first recess (or a second recess) according to one embodiment of the present disclosure.

The following description is directed to the first recess 30 (or the second recess 32). FIG. 3 is a schematic drawing of the first recess 30 (or the second recess 32) according to one embodiment of the present disclosure. As shown in FIG. 3, in one section, the first recess 30 may have a first recess vertex P5, and flexible substrate 20 may have a first recess depth d7 that is the distance between the first surface F1 and the first recess vertex P5. The phrase "first recess vertex P5" may be defined as a terminal of the first recess 30 that is farthest away from the first substrate structure 10 or the first surface F1. In other words, the first recess vertex P5 may also be deemed a point where the first recess 30 is closest to the second surface F2. In one embodiment, the first recess vertex P5 may be deemed the terminal of the flexible substrate 20 as its thinnest part. The phrase "first recess depth d7" may be defined as the shortest distance between the first surface F1 and the first recess vertex P5. Additionally, the insulating layer 24 of the flexible substrate 20 in one section may have an insulating thickness (i.e. the sixth thickness d6). The sixth thickness d6 may be deemed the shortest distance between the first surface F1 and the connecting surface F21. The connecting surface F21 is a surface that connects the circuit layer 22 to the insulating layer 24.

In one embodiment, the absolute value of difference between the sixth thickness d6 and the first recess depth d7 may be smaller than or equal to a half of the thickness of the insulating layer 24

$$\left(\text{i.e. } |d6 - d7| \le \frac{d6}{2}\right).$$

Additionally, in one embodiment, the sixth thickness d6 may range between 0.5 microns and 50 microns. In one embodiment, the first recess depth d7 may range between 0.26 microns and 50 microns. Additionally, where the flexible substrate 20 has the second recess 32, the description of the first recess 30 may apply to the second recess 32. That is, the second recess 32 may have its recess depth equal to that of the first recess depth d7.

Moreover, while the embodiment of FIG. 3 is illustrated based on the embodiment of FIG. 1(C), it is understood to people skilled in the art that the embodiment of FIG. 1(D) or FIG. 1(E) may be alternatively combined with the present embodiment.

Figure 4:
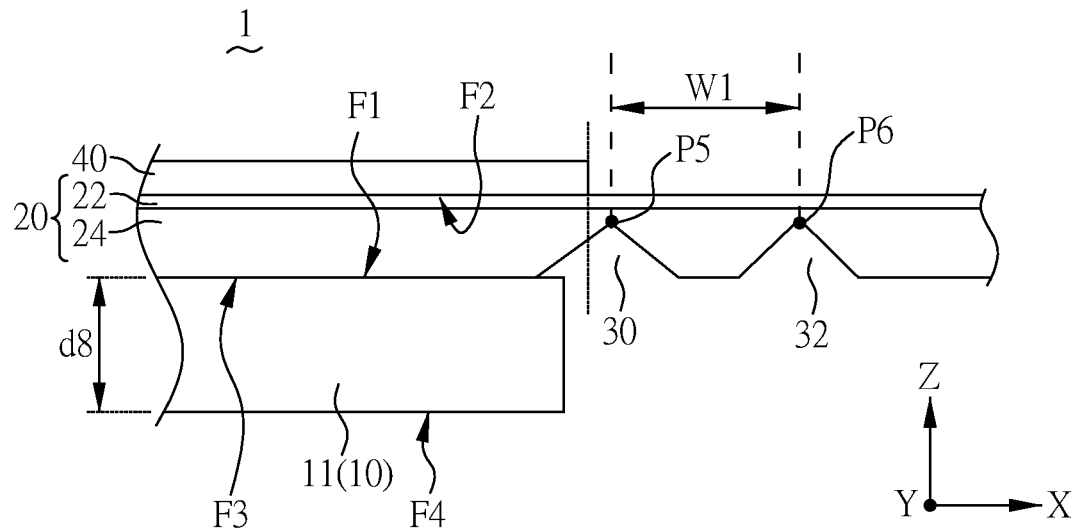
FIG. 4 is a section schematic drawing of the first recess, the second recess and the first substrate structure according to one embodiment of the present disclosure.

The following description is directed to the relationship among the first recess 30, the second recess 32 and the first substrate structure 10. FIG. 4 is a schematic cross-sectional view of the first recess 30, the second recess 32 and the first substrate structure 10 according to one embodiment of the present disclosure, showing the flexible substrate 20 having the first recess 30 and the second recess 32. According to FIG. 4, the first recess 30 has a first recess vertex P5. The first recess vertex P5 may be for example a terminal on the edge of the first recess 30 that is away from the first substrate structure 10 or the first surface F1. The second recess 32 may also have a second recess vertex P6 that is away from the first substrate structure 10 or the first surface F1. In one embodiment, the second recess vertex P6 may be for example a terminal on the edge of the second recess 32 furthest away from the first substrate structure 10 or the first surface F1. In one embodiment, the second recess vertex P6 may be deemed the terminal of the thinnest part of the flexible substrate 20. Additionally, in one section, the first substrate structure 10 may have a first substrate structure thickness d8. The first substrate structure thickness d8 may be defined as the shortest distance between the upper surface F3 and the lower surface F4. Besides, in one section, there may be a recess vertex interval W1 between the first recess vertex P5 and the second recess vertex P6. This recess interval W1 is defined as the distance between the two recess vertexs in a direction. In one embodiment, the measuring direction of the recess vertex interval W1 may be parallel to the second direction (e. g. the direction of the X axis). That is, the measurement is made when the electronic device is not bent. However, the measurement may be made when the electronic device has been bent. In this case, the recess vertex interval W1 is parallel to the direction of the Z axis.

Referring to FIG. 4, in one embodiment, the recess vertex interval W1 may be greater than or equal to the first substrate structure thickness d8. In one embodiment, the recess vertex interval W1 ranges between 0.11 mm and 1.1 mm. In one embodiment, the first substrate structure thickness d8 ranges between 0.1 mm and 1 mm. Besides, the first recess 30 or the second recess 32 of the embodiment of FIG. 1(D) or FIG. 1(E) may be incorporated into the present embodiment.

Figure 5:
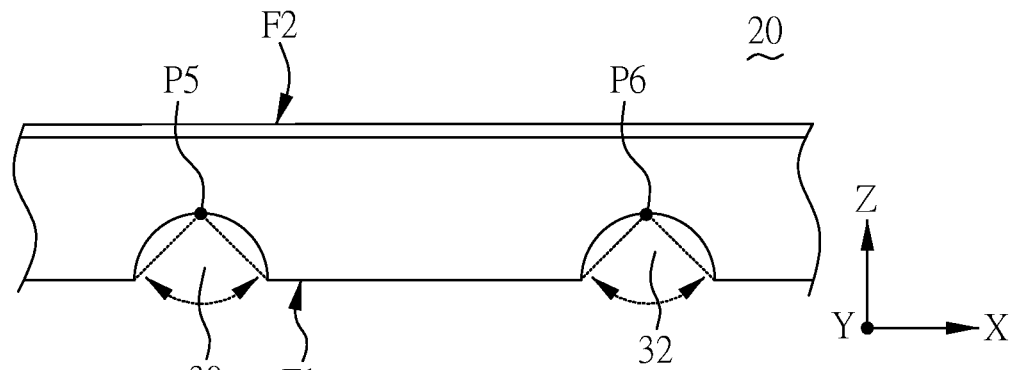
FIG. 5 is a schematic drawing of the first recess (or the second recess) according to another embodiment of the present disclosure.

In the present disclosure, the first recess 30 (or the second recess 32) may itself have various aspects. FIG. 5 is a schematic drawing of the first recess 30 (or the second recess 32) according to another embodiment of the present disclosure. As shown in FIG. 5, the first recess 30 may be semicircular, but not limited thereto. The first recess 30 of the present embodiment may be of any shape, such as semicircle, triangle, rectangle, non-rectangle, trapezoid, and polygon, without limitation. In one embodiment where the flexible substrate 20 has the second recess 32, the second recess 32 may similarly be of any shape. In one embodiment, the first recess 30 and the second recess 32 are of the same shape. In one embodiment, the first recess 30 and the second recess 32 may be of the same size. In one embodiment, the first recess 30 and the second recess 32 may be of different shapes.

It is to be noted that the embodiment of FIG. 5 may be combined with any of the foregoing embodiment provided that the combination is reasonable.

Figure 6:
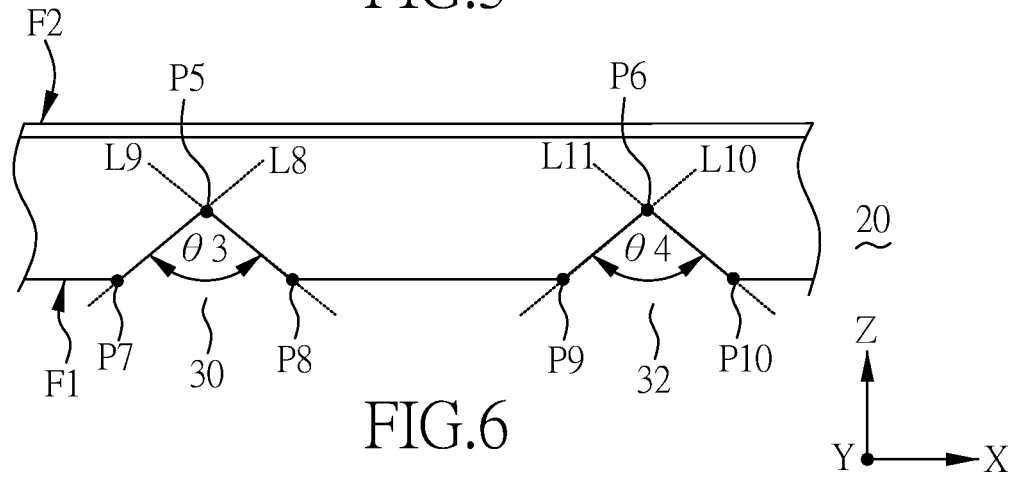
FIG. 6 is a schematic drawing of the first recess (or the second recess) according to yet another embodiment of the present disclosure.

FIG. 6 is a schematic drawing of the first recess 30 (or the second recess 32) according to yet another embodiment of the present disclosure. As shown in FIG. 6, the first recess 30 may have a first recess vertex P5. As this part may refer to the foregoing embodiments, no repeated description is given herein. In one section, a first opening point P7 and a second opening point P8 may be two junction points between the first recess 30 and the first surface F1, i.e. the first opening point P7 is a first junction point between the first recess 30 and the first surface F1, and the second opening point P8 is a second junction point between the first recess 30 and the first surface F1. The first opening point P7 and the second opening point P8 may be defined as two starting points of the first opening 30 in one section from which the first surface F1 is sunken to form the recess. An eighth extension line L8 is defined as a link between the first opening point P7 and the first recess vertex P5. A ninth extension line L9 is defined as a link between the second opening point P8 and the first recess vertex P5. In one embodiment, the eighth extension line L8 and the ninth extension line L9 jointly include a third included angle $\theta_3$. In one embodiment, the third included angle $\theta_3$ is at least of 90 degrees (i.e. $90°\le\theta_3$). In one embodiment, the third included angle $\theta_3$ is not greater than 180 degrees (i.e. $\theta_3<180°$). In one embodiment, the third included angle $\theta_3$ may range between 90 degrees and 180 degrees (i.e. $90°\le\theta_3<180°$).

In addition, in an embodiment where the flexible substrate 20 has the second recess 32, the second recess 32 may have a second recess vertex P6. In one section, a third opening point P9 and a fourth opening point P10 two junction points of the second recess 32 and the first surface F1. A tenth extension line L10 is defined as a link between the third opening point P9 and the second recess vertex P6. An eleventh extension line L11 is defined as a link between the fourth opening point P10 and the second recess vertex P6. The tenth extension line L10 and the eleventh extension line L11 jointly include a fourth included angle $\theta_4$. In one embodiment, the fourth included angle $\theta_4$ is of at least 90 degrees (i.e. $90°\le\theta_4$). In one embodiment, the fourth included angle $\theta_4$ is not greater than 180 degrees (i.e. $\theta_4<180°$). In one embodiment, the third included angle $\theta_4$ may range between 90 degrees and 180 degrees (i.e. $90°\le\theta_4<)180°$. In one embodiment, the third included angle $\theta_3$ may be equal to the fourth included angle $\theta_4$.

It is to be noted that the embodiment of FIG. 6 may be combined with any of the foregoing embodiments provided that the combination is reasonable.

Figure 7A:
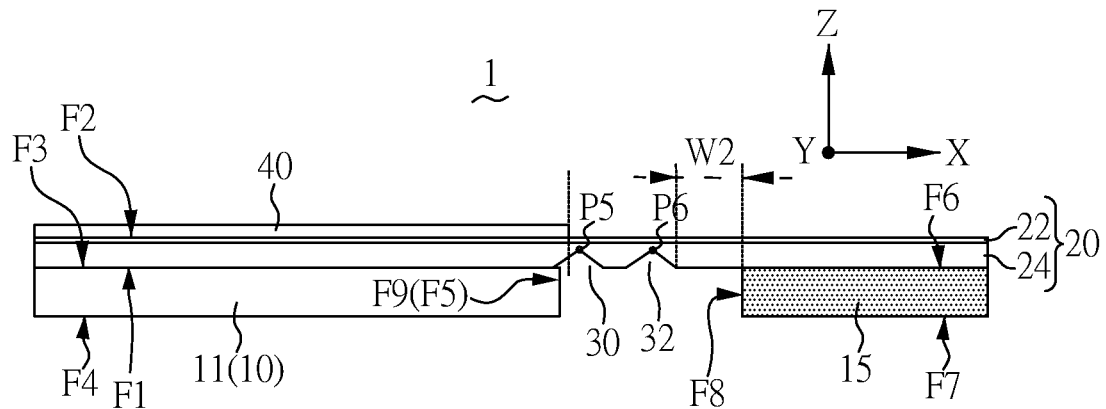
FIG. 7(A) is a detailed structure diagram of the electronic device according to yet another embodiment of the present disclosure.

The disclosed electronic device 1 may itself have various aspects. FIG. 7(A) is a detailed structure diagram of the electronic device 1 according to yet another embodiment of the present disclosure, showing the flexible substrate 20 not bent. Referring also to FIG. 1(B) and FIG. 7(A), the disclosed electronic device 1, similar to the embodiment of FIG. 1(B), has the first substrate structure 10, the flexible substrate 20, the first recess 30, and also the second recess 32 as well as the display medium layer 40. As this part may refer to the description of FIG. 1(B), no repeated description is given herein. The embodiment of FIG. 7(A) has a point that the electronic device 1 further comprises a second substrate structure 15. In view of the Z direction, the second substrate structure 15 has an area smaller than that of the first substrate structure 10. The second substrate structure 15 has a second substrate structure upper surface F6, a second substrate structure lower surface F7, and a second substrate structure lateral surface F8. The second substrate structure upper surface F6 and the second substrate structure lower surface F7 may extend in the direction of the X axis. The second substrate structure lateral surface F8 may extend in the direction of the Z axis. The flexible substrate 20 has a part thereof disposed on the upper surface F3 of the first substrate structure 10, and the flexible substrate 20 has a part thereof disposed on the second substrate structure upper surface F6. In other words, the flexible substrate 20 connects the first substrate structure 10 to the second substrate structure 15. In one embodiment, in view of the Z direction, the second substrate structure upper surface F6 and second substrate structure lower surface F7 may face each other. In one embodiment, In view of the X direction, the second substrate structure lateral surface F8 and the lateral surface F5 of the first substrate structure 10 face each other.

In one embodiment, the second substrate structure 15 and the first substrate structure 10 may comprise the same material, without limitation. In one embodiment, the second substrate structure 15 may have a thickness equal to that of the first substrate structure 10, without limitation.

As shown in FIG. 7(A), the second substrate structure 15 and the first substrate structure 10 are separated. Stated differently, the second substrate structure 15 and the first substrate structure 10 are disposed on different locations on the flexible substrate 20. In one embodiment, in view of the X direction, the first recess 30 and the second recess 32 may be located between the combination of the first substrate structure 10 and the flexible substrate 20 and the combination of the second substrate structure 15 and the flexible substrate 20. In one embodiment, the first recess 30 and the second recess 32 may be located between two furthest edges of the first substrate structure 10 and the second substrate structure 15. In one embodiment, the first recess 30 and the second recess 32 may be located between two closest edges of the first substrate structure 10 and the second substrate structure 15, without limitation. In one embodiment, in view of the X direction, the combination of the second substrate structure 15 and the flexible substrate 20 is locationally corresponding to a region not covering the display medium layer 40, the first recess 30, and the second recess 32, so that when the flexible substrate 20 is bent, the second substrate structure 15 is driven to come into contact with the lower surface F4 of the first substrate structure 10. For example, the second substrate structure lower surface F7 may come into contact with the lower surface F4.

As shown in FIG. 7(A), the second recess 32 and the second substrate structure 15 may form a specific distance (defined as the second interval W2) in the direction of the X axis. As the second interval W2 varies, the electronic device 1 has different appearances when the flexible substrate 20 is bent.

Figure 7B:
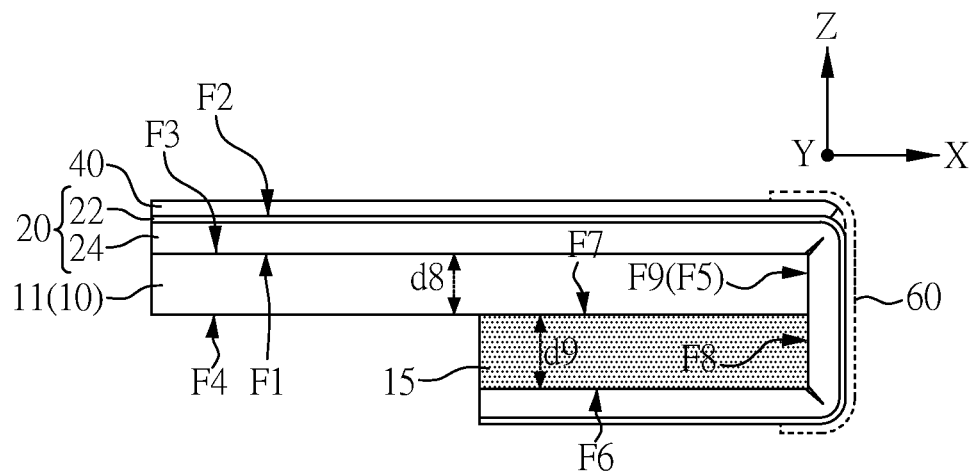
FIG. 7(B) is a detailed structure diagram of the embodiment of FIG. 7(A) showing its flexible substrate bent in one aspect.

FIG. 7(B) is a detailed structure diagram of the embodiment of FIG. 7(A) showing the flexible substrate 20 bent. As shown in FIG. 7(B), when the flexible substrate 20 is bent, the first surface F1 of the flexible substrate 20 covers the upper surface F3 of the first substrate structure 10, the lateral surface F5 of the first substrate structure 10, the second substrate structure lateral surface F8, and the second substrate structure upper surface F6. The second substrate structure lower surface F7 may come into contact with the lower surface F4 of the first substrate structure. The state as shown in FIG. 7(B) appears when the second interval W2 of FIG. 7(A) has a relatively small value, such as close to 0. In this case, when the flexible substrate 20 is bent, the lateral surface F5 of the first substrate structure 10 and the second substrate structure lateral surface F8 are almost aligned with each other in the direction of the X axis (meaning that they are in the same location or in close locations in the direction of the X axis). In one embodiment, the recess interval W1 may be greater than or equal to the combined thickness of the first substrate structure thickness d8 and the second substrate structure thickness d9 in the direction of the Z axis (i.e. $d8+d9 \leq W1$), and the recess interval W1 may be smaller than the sum of the combined thickness plus 13 microns (um) (i.e. $W1<d8+d9+13$ um). In other words, the recess interval satisfies the condition: $d8+d9<W1<d8+d9+13$ um.

It is to be noted that, the present embodiment may be combined with the embodiment of FIG. 1(D). Particularly, the buffer element 50 of FIG. 1(D) contacts the lateral surface F9 and the first surface F1 of the first substrate 11, and the buffer element 50 may contact the lateral surface F8 of the second substrate structure and the first surface F1. Besides, the present embodiment may be combined with the embodiment of FIG. 1(E). Particularly, the protector 60 can cover the second surface F2 of the flexible substrate 20.

Figure 7C:
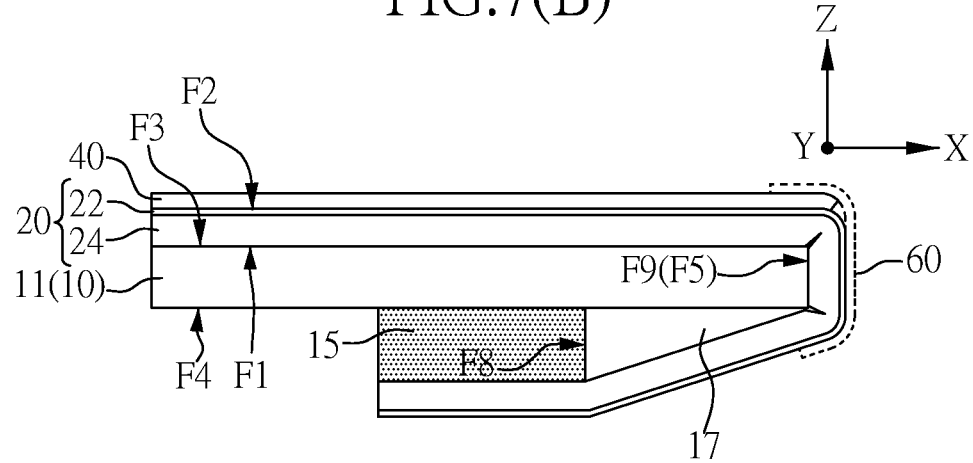
FIG. 7(C) is a detailed structure diagram of the embodiment of FIG. 7(A) showing its flexible substrate bent in another aspect.

FIG. 7(C) is a detailed structure diagram of the embodiment of FIG. 7(A) showing the flexible substrate bent. As shown in FIG. 7(C), when the flexible substrate 20 is bent, the flexible substrate 20 covers the upper surface F3 of the first substrate structure 10, the lateral surface F5 of the first substrate structure 10 and the second substrate structure upper surface F6. The second substrate structure lower surface F7 comes into contact with the lower surface F4 of the first substrate structure. Since the second substrate structure lateral surface F8 and the first surface F1 do not contact each other, an interval space 17 is formed there between. The state as depicted in FIG. 7(C) appears when the second width W2 of FIG. 7(A) has a relatively great value. In this case, when the flexible substrate 20 is bent, the lateral surface F5 of the first substrate structure 10 and the second substrate structure lateral surface F8 are located in different locations in the direction of the X axis.

Figure 7D:
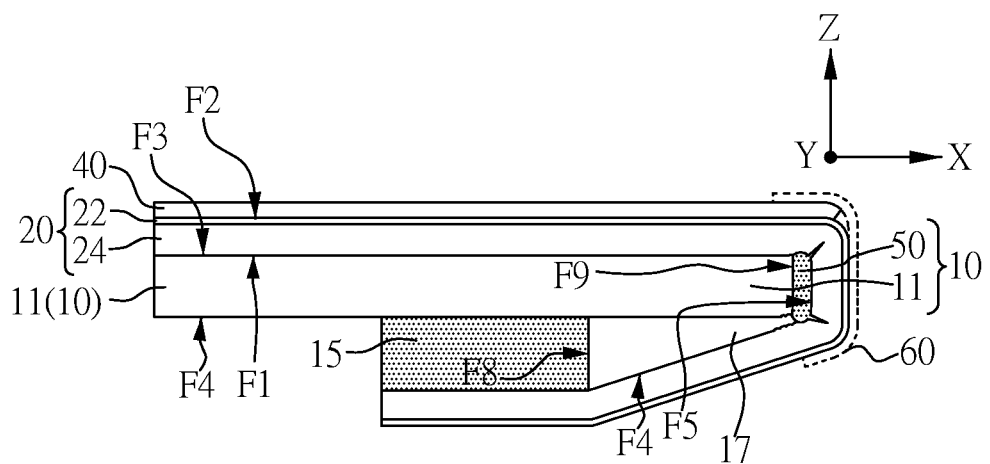
FIG. 7(D) is a structure diagram of the electronic device according to another embodiment of the present disclosure.

FIG. 7(D) shows another embodiment of the present disclosure. As shown, the first substrate structure 10 has the buffer element 50, and the first substrate structure 10 has the third surface F3, the fourth surface F4 or the lateral surface F5 uneven.

It is to be noted that, the present embodiment may be combined with the embodiment of FIG. 1(D). Particularly, the buffer element 50 of FIG. 1(D) may contact the lateral surface F9 and the first surface F1 of the first substrate 11, and the interval space 17 may also be filled with the buffer element 50. Besides, the present embodiment may also be combined with the embodiment of FIG. 1(E). Particularly, the protector 60 can cover the second surface F2 of the flexible substrate 20.

In the present disclosure, the electronic device 1 made according to the foregoing embodiments may work with a touch panel to form a touch device. Furthermore, the electronic device or touch device of the present disclosure as made according to the foregoing embodiments is applicable to any electronic device that uses a flexible substrate as known in the art, such as a display, a mobile phone, a laptop computer, a tablet computer, a watch, a VR display, a video camera, a still camera, a music player, a navigator, a TV, a vehicle instrument panel, a center console, an electronic back mirror, a head-up display, an antenna, or a sensor.

With the provision of recess(es), the flexible substrate can afford more bending and better lean against the lateral surface of the first substrate structure, thereby protecting the circuit layer thereon from damage. As a result, the disclosed electronic device better contributes to bezel-less designs or seamless fabrications.

The present disclosure has been described with reference to the embodiments and it is understood that the embodiments are not intended to limit the scope of the present disclosure. Moreover, as the contents disclosed herein should be readily understood and can be implemented by a person skilled in the art, all equivalent changes or modifications which do not depart from the concept of the present disclosure should be encompassed by the appended claims.

What is claimed is:

1. An electronic device, comprising:
   a first substrate structure;
   a flexible substrate, disposed on the first substrate structure and having a first surface close to the first substrate structure;
   a first recess, disposed on the first surface of the flexible substrate; and
   a display medium layer, disposed on the flexible substrate, wherein the flexible substrate and the first recess are between the first substrate structure and the display medium layer,
   wherein before the flexible substrate bends, the first recess overlaps the first substrate structure, and the display medium layer does not overlap a first recess vertex of the first recess.

2. The electronic device of claim 1, further comprising a second recess, disposed on the first surface of the flexible substrate.

3. The electronic device of claim 2, wherein the first recess vertex is away from the first substrate structure, the second recess has a second recess vertex away from the first substrate structure, the first substrate structure has a first substrate structure thickness, a recess vertex interval is between the first recess vertex and the second recess vertex, the recess vertex interval is greater than or equal to the first substrate structure thickness.

4. The electronic device of claim 2, wherein the first substrate structure has an upper surface, a lateral surface connected to the upper surface, and a lower surface connected to the lateral surface and opposite to the upper surface, and the flexible substrate covers at least a part of the upper surface, at least a part of the lateral surface, and at least a part of the lower surface.

5. The electronic device of claim 2, further comprising a second substrate structure, which has an area smaller than an area of the first substrate structure.

6. The electronic device of claim 1, further comprising a second substrate structure, wherein the flexible substrate connects the first substrate structure with the second substrate structure, and the second substrate structure at least partially overlaps the first substrate structure.

7. The electronic device of claim 1, wherein the flexible substrate includes an insulating layer, the first recess is located in the insulating layer, the first recess has a first recess depth, and the insulating layer has an insulating thickness, an absolute value of a difference between the insulating thickness and the first recess depth is smaller than or equal to a half of the insulating thickness.

8. The electronic device of claim 1, wherein the first substrate structure has an upper surface, a lateral surface connected to the upper surface, the flexible substrate covers the upper surface and the lateral surface, the flexible substrate has a first bending part and the first bending part has a bending radius of curvature, and the bending radius of curvature is greater than 0 microns (μm) and less than or equal to 100 microns (μm).

9. The electronic device of claim 1, wherein the first substrate structure comprises a first substrate, and a buffer element, and the buffer element contacts the first surface and a lateral surface of the first substrate.

10. The electronic device of claim 1, wherein the flexible substrate has a second surface away from the first substrate structure, and a first opening point and a second opening point; wherein the first opening point is a first junction point between the first recess and the first surface, and the second opening point is a second junction point between the first recess and the first surface, and a first link between the first opening point and the first recess vertex and a second link between the second opening point and the first recess vertex include an included angle, and the included angle ranging between 90 degrees and 180 degrees before bending.

11. The electronic device of claim 8, wherein the flexible substrate further has a second bending part, wherein the second bending part has an another bending radius of curvature, and the another bending radius of curvature is greater than 0 microns (μm) and less than or equal to 100 microns (μm).

12. The electronic device of claim 8, wherein the bending radius of curvature is greater than 0 microns (μm) and less than or equal to 50 microns (μm).

13. The electronic device of claim 12, wherein the bending radius of curvature is greater than 0 microns (μm) and less than or equal to 10 microns (μm).

14. The electronic device of claim 9, wherein the buffer element comprises an adhesive material.

15. The electronic device of claim 14, wherein the buffer element comprises a double-sided tape, an UV-cured adhesive, or a heat-cured adhesive.

16. The electronic device of claim 14, wherein the buffer element has a buffer element thickness, and the buffer element thickness is greater than 0 cm and less than or equal to 1 cm.

17. The electronic device of claim 1, wherein the first substrate structure comprises a first substrate, and the first substrate comprises an insulating material.

18. The electronic device of claim 17, wherein the first substrate comprises glass, Polyethylene Terephthalate or Polyimide.

19. The electronic device of claim 1, wherein the flexible substrate comprises an insulating material.

20. The electronic device of claim 19, wherein the flexible substrate comprises glass, or Polyimide.

* * * * *